(12) United States Patent
Lewis

(10) Patent No.: US 7,642,861 B2
(45) Date of Patent: Jan. 5, 2010

(54) LOCKED LOOP SYSTEM

(75) Inventor: Michael Lewis, London (GB)

(73) Assignee: Infineon Technologies, Neubiberg (DE)

( * ) Notice: Subject to any disclaimer, the term of this patent is extended or adjusted under 35 U.S.C. 154(b) by 110 days.

(21) Appl. No.: 11/863,126

(22) Filed: Sep. 27, 2007

(65) Prior Publication Data

US 2009/0085677 A1 Apr. 2, 2009

(51) Int. Cl.
*H03L 7/087* (2006.01)

(52) U.S. Cl. .......................... 331/11; 327/145; 327/148

(58) Field of Classification Search .................. 331/10, 331/11, 17; 327/145, 148
See application file for complete search history.

(56) References Cited

U.S. PATENT DOCUMENTS 7,030,711 B2 * 4/2006 Steinbach et al. ........... 331/179
7,071,743 B2 * 7/2006 Starr .......................... 327/147

* cited by examiner

*Primary Examiner*—Robert Pascal
*Assistant Examiner*—James E Goodley
(74) *Attorney, Agent, or Firm*—Lee & Hayes, PLLC

(57) ABSTRACT

This disclosure relates to a phase locked loop and a frequency locked loop.

18 Claims, 6 Drawing Sheets

LOCKED LOOP SYSTEM

BACKGROUND

Mobile devices (e.g. mobile telephones) typically operate using multiple frequency sources. The first frequency source is a high-frequency crystal clock (e.g., having a reference frequency of 26 MHz) used in active modes, such as when communicating with the cellular base-station or performing high frequency processing. The second frequency source is a low-frequency clock (e.g., having a reference frequency of 32 kHz) that is used for maintaining a time base during idle states. The second, low-frequency clock avoids current consumed in generating and distributing the high frequency clock source, as well as current consumed in devices connected to the high frequency clock that do not implement adequate clock gating.

According to conventional designs, separate circuits having different components are required to utilize the high frequency and low frequency sources.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are techniques for locking the frequency of a signal. A system is provided having a phase locked loop (PLL) mode and/or a frequency locked loop (FLL) mode. In one described implementation, a switchable circuit is formed that is operable to switch between the PLL and FLL modes.

When in the PLL mode, the switchable circuit operates as an electronic control system that generates a signal that is locked to the phase of an input or "reference" signal. The circuit compares the phase of a controlled oscillator to the reference signal. In response to the comparison, the system automatically raises or lowers the frequency of the controlled oscillator until its phase (and therefore its frequency) is matched to that of the reference.

When in the FLL mode, the switchable circuit operates as an electronic control system that generates a signal that is locked to the frequency of the input or "reference" signal. This FLL circuit compares the frequency of a controlled oscillator to the reference signal and automatically raises or lowers the frequency of the controlled oscillator until its frequency is matched to that of the reference.

The techniques described herein may be implemented in a number of ways. Exemplary environments and context are provided below with reference to the included figures and on going discussion.

Exemplary Systems

Figure 1:
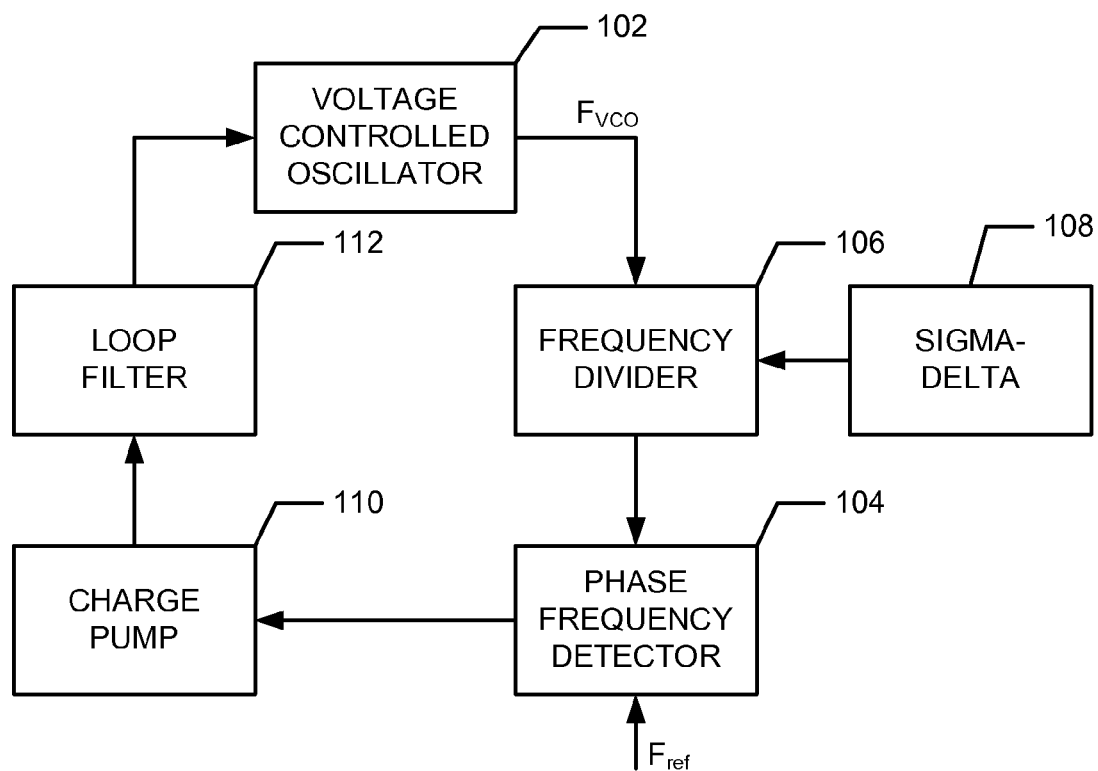
FIG. 1 shows a block diagram of an implementation of a system having a phase locked loop.

FIG. 1 shows an exemplary system for generating and locking the frequency of a relatively high frequency signal, e.g., 26 MHz. The system may be generally referred to as a phase locked loop (PLL) 100. Each block represents one or more discrete and/or integrated components for performing a particular function with regard to the PLL 100. The discrete and/or integrated components may be coupled together in one or more circuits.

The exemplary PLL 100 is operable to produce a voltage controlled oscillator signal $F_{VCO}$ from a voltage controlled oscillator 102 based on a reference signal $F_{REF}$, received by a phase frequency detector 104. The reference signal $F_{REF}$ may be any type of electronic signal, and may be provided to a phase frequency detector 104 from a local or remote signal source. The signal $F_{VCO}$ is output by the voltage controlled oscillator 102 and provided to a frequency divider 106, which divides the signal to the same frequency, on average, as the reference signal. A sigma-delta converter 108 may be connected to the frequency divider 108, to provide a time-varying division ratio and thereby an effective division ratio that is not an integer value (a so-called fractional-N PLL). The phase frequency detector 104 receives the signal output by the frequency divider 106 and generates a control signal proportional to the phase/frequency difference between the reference signal $F_{REF}$ and the output signal of the frequency divider 106, which is a divided representation of the signal $F_{VCO}$. The phase frequency detector 104 outputs the control signal to a charge pump 110. The charge pump 110 drives a low-pass loop filter 112, which suppresses the reference frequency and generates a steady control voltage. The steady control voltage is provided to the voltage controlled oscillator 102. If the frequency of the output signal $F_{VCO}$, as modified by the frequency divider, is different than that of the reference signal $F_{REF}$, the PLL circuit 100 causes the frequency of the voltage controlled oscillator 102 to deviate in the direction of the reference signal $F_{REF}$. Thus, as a result of the PLL 100, the phase difference (and therefore the frequency difference) between $F_{VCO}$ and $F_{REF}$ at the phase frequency detector becomes zero, or the phase difference becomes very small with a zero frequency difference.

The voltage controlled oscillator 102 is a device or system of devices that provides an output clock signal with a frequency that is proportional to the level of the input voltage. The clock signal is then fed back to the phase frequency detector 104 by way of the frequency divider 106. The voltage controlled oscillator 102 may be a ring oscillator or an inductive oscillator (LC oscillator) that oscillates by charging and discharging a capacitor through an inductor. The voltage controlled oscillator 102 may alternatively be a crystal oscillator, such as a surface-acoustic-wave device (SAW), a piezoelectric quartz crystal that mechanically vibrates between two slightly different shapes, or other suitable crystal oscillator.

The frequency divider 106 is a device or system of devices that is located between the voltage controlled oscillator 102 and the phase detector 104 to produce desired frequencies based on the reference signal $F_{REF}$. The frequency divider 106 may be programmable using conventional logic to accommodate various desired frequencies, such as the reference frequency.

The sigma delta converter 108 is a device or system of devices that switches the division ratio of the frequency divider 106 between a number of integer division ratios to provide an effective fractional division ratio lying between the integer ratios.

The phase frequency detector 104 is an electronic device or system of devices that compares the phase of two input signals. The phase frequency detector 104 has two inputs, each receiving a signal. As described above, one signal, $F_{VCO}$, is provided by the voltage controlled oscillator 102 via the frequency divider 106. The other signal is a reference signal, $F_{REF}$, and may be provided by a source that is integrated with or external to system 100. The phase frequency detector 104 outputs a signal that instructs subsequent circuitry how to adjust in order to lock onto the phase of the input signal.

The charge pump 110 is a device or system of devices that receives the signal output by the phase frequency detector 104. The charge pump 110 generates one or more fast pulses that push the voltage controlled oscillator 102 to the desired frequency.

The loop filter 112 is a device or system of devices that may include a low pass filter. The loop filter 112 integrates the signal output by the charge pump 110 to filter out the edges of the pulses and create a smoothed signal. This smoothed signal is fed to the voltage-controlled oscillator 102.

The PLL 100 may generate, receive, and/or process analog or digital signals and is operable at various frequencies, including output frequencies from a fraction of a cycle per second up to many gigahertz (GHz). However, to operate with low reference frequencies it is necessary to have a low cut-off frequency for the loop filter, and therefore very large values for components such as capacitors that are impractical for integrated circuit integration. The PLL 100 may be used in, for example, radio communication (e.g., a low-cost portable FM transmitter,), to generate stable frequencies, or to recover a signal from a noisy communication channel.

Figure 2:
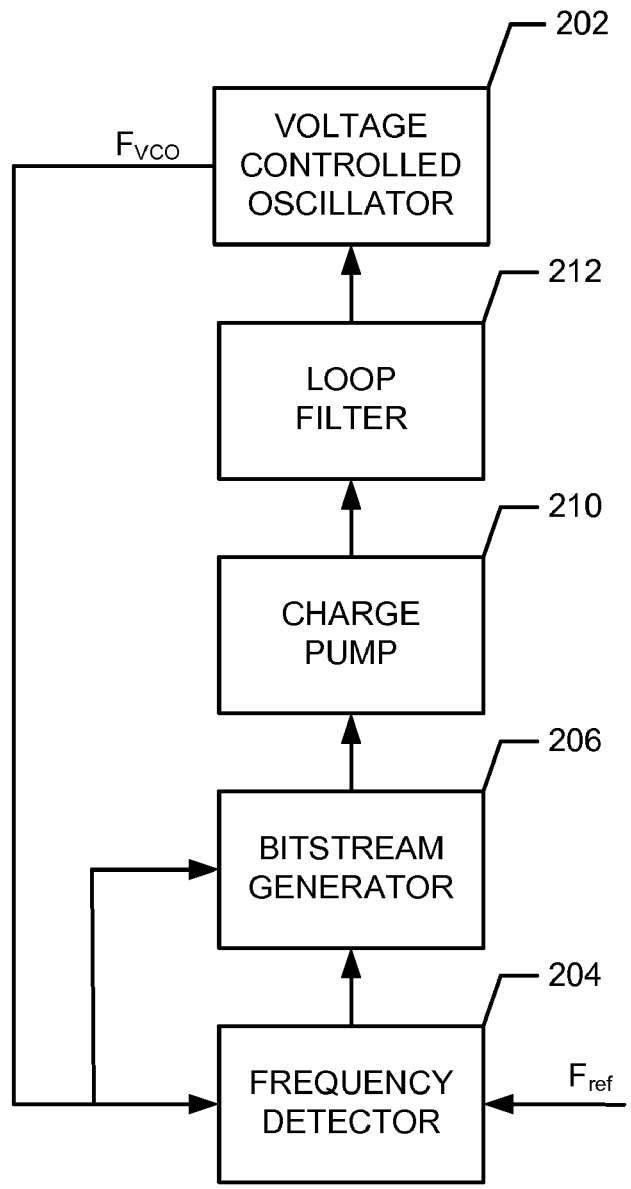
FIG. 2 shows a block diagram of an implementation of a system having a frequency locked loop.

FIG. 2 shows an exemplary system for a frequency locked loop (FLL) 200, which may be used for locking signals that have lower frequencies (e.g. 32 kHz). In the FLL 200, the operating frequency of a signal $F_{VCO}$ is adjusted by measuring the relative frequencies of the reference signal $F_{REF}$ and voltage controlled oscillator signal $F_{VCO}$ over a series of reference clock cycles. Each block in the FLL 200 represents one or more discrete and/or integrated components for performing a particular function with regard to the FLL 200. The discrete and/or integrated components may be coupled together in one or more circuits.

The FLL 200 includes a voltage controlled oscillator 202 that provides an output signal $F_{VCO}$ with a frequency that is proportional to the level of the input voltage. The $F_{VCO}$ signal is then fed back to a frequency detector 204 for performing a frequency measurement. A reference signal $F_{REF}$ is also provided to the frequency detector 204. The frequency detector 204 compares the frequency of the reference signal $F_{REF}$ to the frequency of the signal $F_{VCO}$, which is output by the voltage controlled oscillator 202. Based on this comparison, the frequency detector 204 generates a digital control value that is related to the error between the frequency of the reference signal and the frequency of the signal output by the voltage controlled oscillator. The control signal is provided to a bitstream generator 206. The bitstream generator operates in combination with the charge pump 210 and loop filter 212 as, in essence, a digital to analog converter, the output of which is an analog signal. This analog signal is provided to the voltage controlled oscillator, which generates $F_{VCO}$ based on the signal received from the loop filter 212.

The frequency detector 204 is an electronic device or system of devices that measures and compares the frequency of $F_{REF}$ to the frequency of $F_{VCO}$ over a given period of time. The frequency of the signal actually output by the voltage controlled oscillator 202 may be divided by a pre-selected value prior to the measurement in order to obtain a desired frequency of operation.

In response to the measurement, the frequency detector 204 generates a digital control value signal representing the error between the operating frequency of the signal output by the voltage controlled oscillator 202 and a desired frequency for the signal output by the voltage controlled oscillator 202 (as determined by comparison with $F_{REF}$). This digital control value may be a multi-bit digital control word. The digital control value is delivered to the bitstream generator 206. The digital clock for the frequency measurement of the frequency detector 204 may be derived from a suitable fraction of the local oscillator frequency, $F_{VCO}$.

The frequency measurement is made arbitrarily accurate by increasing the number of reference cycles over which the measurement is performed and/or by using a higher digital clock frequency. Given practical frequency deviations of an on-chip LC oscillator, it is possible for the loop to begin operation and lock into the required frequency even if the initial voltage controlled oscillator frequency of the signal $F_{VCO}$ is not close to the final frequency $F_{REF}$, e.g., 104 MHz measured $F_{VCO}$ and 32 kHz $F_{REF}$.

The bitstream generator 206 is a device or system of devices that receives the digital control signal output by the frequency detector 204. The bitstream generator 206 may be a single bit generator. The bitstream generator 206 receives the digital control value and converts this value into, for example, a pulse density modulated or dithered stream of bits. The digital clock for the bitstream generator 206 may be derived from a suitable fraction of the local oscillator frequency, i.e. the frequency of the voltage controlled oscillator 202. The signal output by the bitstream generator 206 may be, for example, pulse width modulated or pulse density modulated.

The bitstream generator 206 may be operated under one of the widely known approaches from DAC theory, such as delta-sigma modulation or multi-bit amplitude shaping (MASH). As such, the digital input to the bitstream generator 206 is the frequency control word generated by the digital frequency detector 204 as a result of a digital frequency measurement.

The charge pump 210 is a device or system of devices that receives the signal output by the bitstream generator 206. As with charge pump 110, charge pump 210 generates one or more fast pulses that push the voltage controlled oscillator 202 to the desired frequency. The charge pump 210 drives a low-pass loop filter 212, which suppresses the reference frequency and generates a steady control voltage at the voltage controlled oscillator 202.

The loop filter 212, like loop filter 112, is a device or system of devices that may include a low pass filter. The loop filter 212 integrates the signal output by the charge pump 210 to filter out the edges of the pulses and create a smoothed signal. This smoothed signal is fed to the voltage-controlled oscillator 202.

Figure 3:
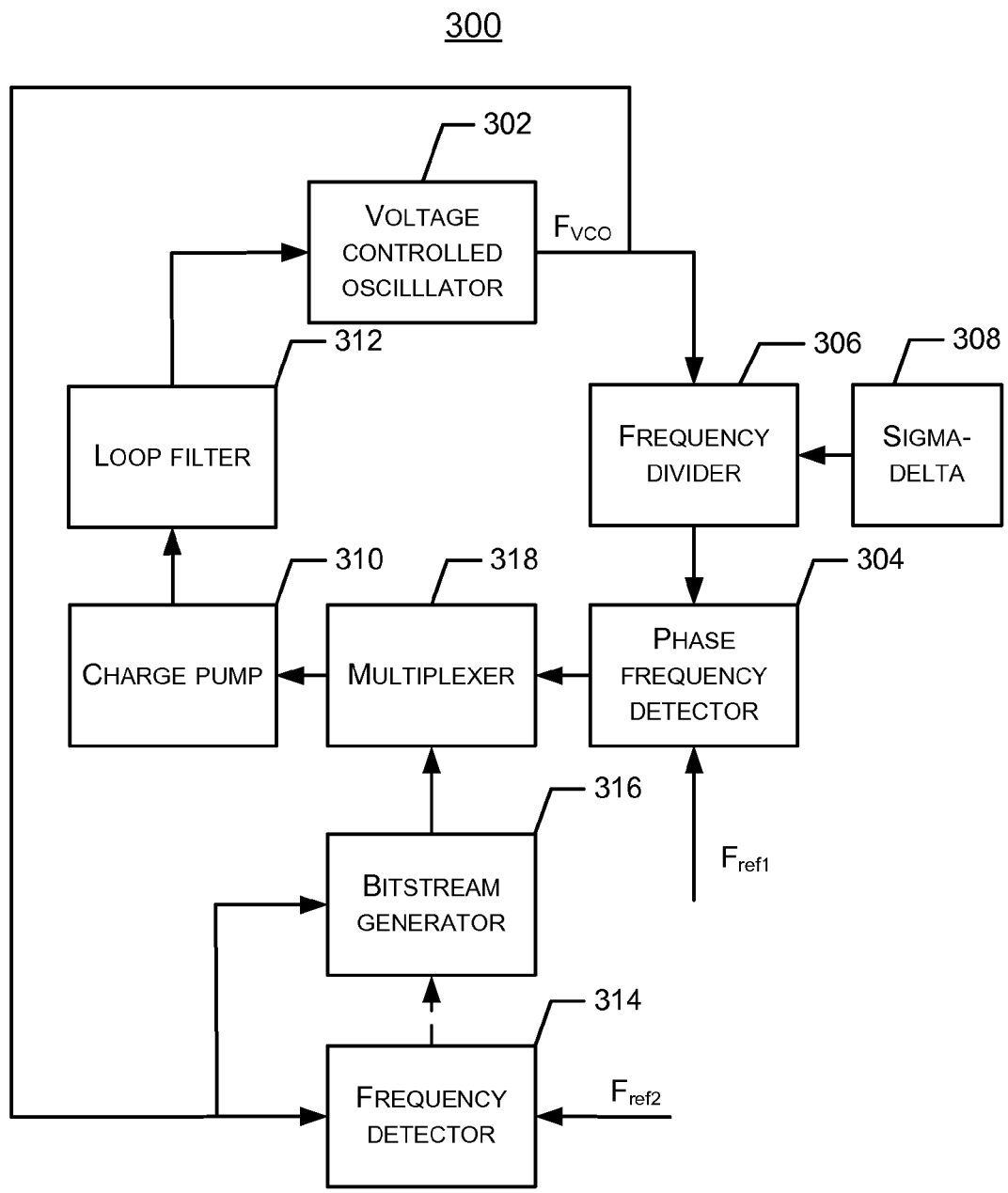
FIG. 3 shows a block diagram of an implementation of a dual-mode system having a phase locked loop (PLL) and a frequency locked loop (FLL) mode.

FIG. 3 shows a dual mode loop system 300 that supports both a high reference frequency operation, using a circuit similar to PLL 100, and a low reference frequency operation, using a circuit similar to FLL 200. According to this implementation, components common to PLL 100 and FLL 200 are shared between the two modes, thus decreasing the complexity and cost of implementing the PLL 100 and FLL 200 as separate systems. Reference frequency signals $F_{REF1}$ and $F_{REF2}$ may have the same or different values and may be generated by the same or different source(s).

A switch, such as multiplexer 318, is provided in the dual mode loop system 300 to toggle between the PLL and FLL modes. The multiplexer 318 may be controlled by control logic or other suitable control mechanism as is well understood in the field of multiplexer control. The multiplexer 318 is coupled to the charge pump 310. The multiplexer 318 is also switchably coupled to the phase frequency detector 304 and the bitstream generator 316. Thus, the charge pump 310 is operable to handle an incoming signal from either the phase frequency detector 304 or the bitstream generator 316.

As with FLL 200, the dual mode loop system 300 utilizes the charge pump 310 as the output stage of a single bit digital to analog converter (DAC). The DAC is operated at a sufficiently high frequency that the loop filter 312 suppresses the noise from the dithered signal output by the charge pump 310.

Figure 4:
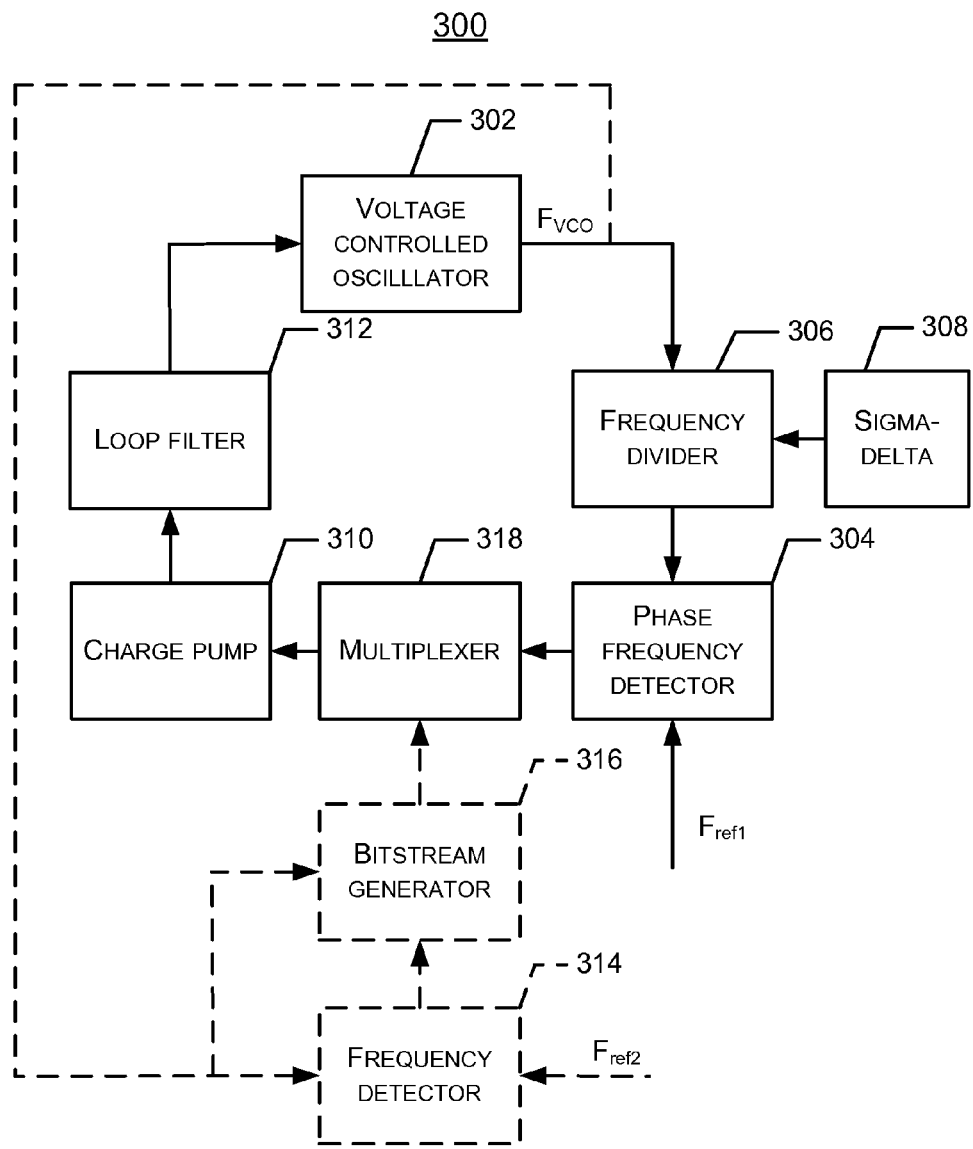
FIG. 4 shows a block diagram of an implementation in which the dual mode system shown in FIG. 3 is operating in a PLL mode.

FIG. 4 shows the system 300 as it operates in the PLL mode. Certain components of the FLL circuit are not utilized, as shown using dashed lines for those components. As will readily be appreciated, in the PLL mode, the system 300 is similar to PLL system 100 and operates accordingly. According to this implementation, a signal $F_{REF1}$ is provided to the phase frequency detector 304 and the multiplexer 318 is controlled to operate system 300 as a PLL circuit.

Figure 5:
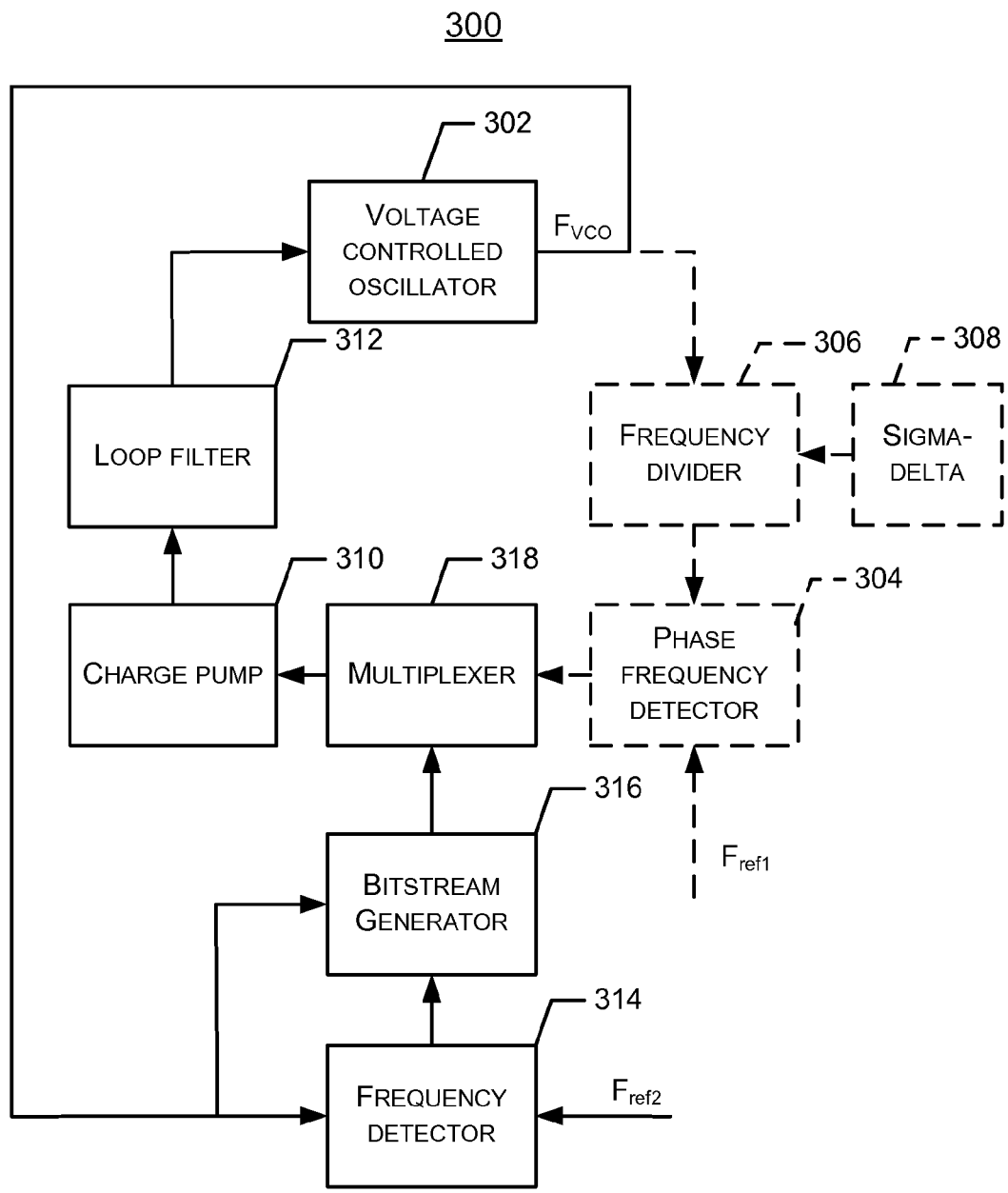
FIG. 5 shows a block diagram of an implementation in which the dual mode system shown in FIG. 3 is operating in an FLL mode.

FIG. 5 shows the system 300 as it operates in the FLL mode. Here, certain components of the PLL circuit are not utilized, as shown using dashed lines for those components. As will readily be appreciated, in the FLL mode, the system 300 is similar to FLL system 200 and operates accordingly. According to this implementation, a signal $F_{REF2}$ is provided to the frequency detector 314 and the multiplexer 318 is controlled to operate system 300 as an FLL circuit.

System 300 may be used in FLL mode for FM transmission with a 32 kHz reference. In this case, a modulating signal is directly summed with a digital word from the frequency control loop. The bitstream generator directly modulates the voltage controlled oscillator frequency, but the long term frequency is stabilized by the frequency locked loop. According to one implementation, the frequency control loop is operated at a lower frequency than the lowest signal frequency (i.e., by way of appropriate clocking). According an alternative implementation, the steady-state frequency of the frequency control loop is altered to follow the modulating signal.

The above systems are shown as exemplary implementations and are meant to serve only as non-limiting examples.

EXEMPLARY PROCESS

Figure 6:
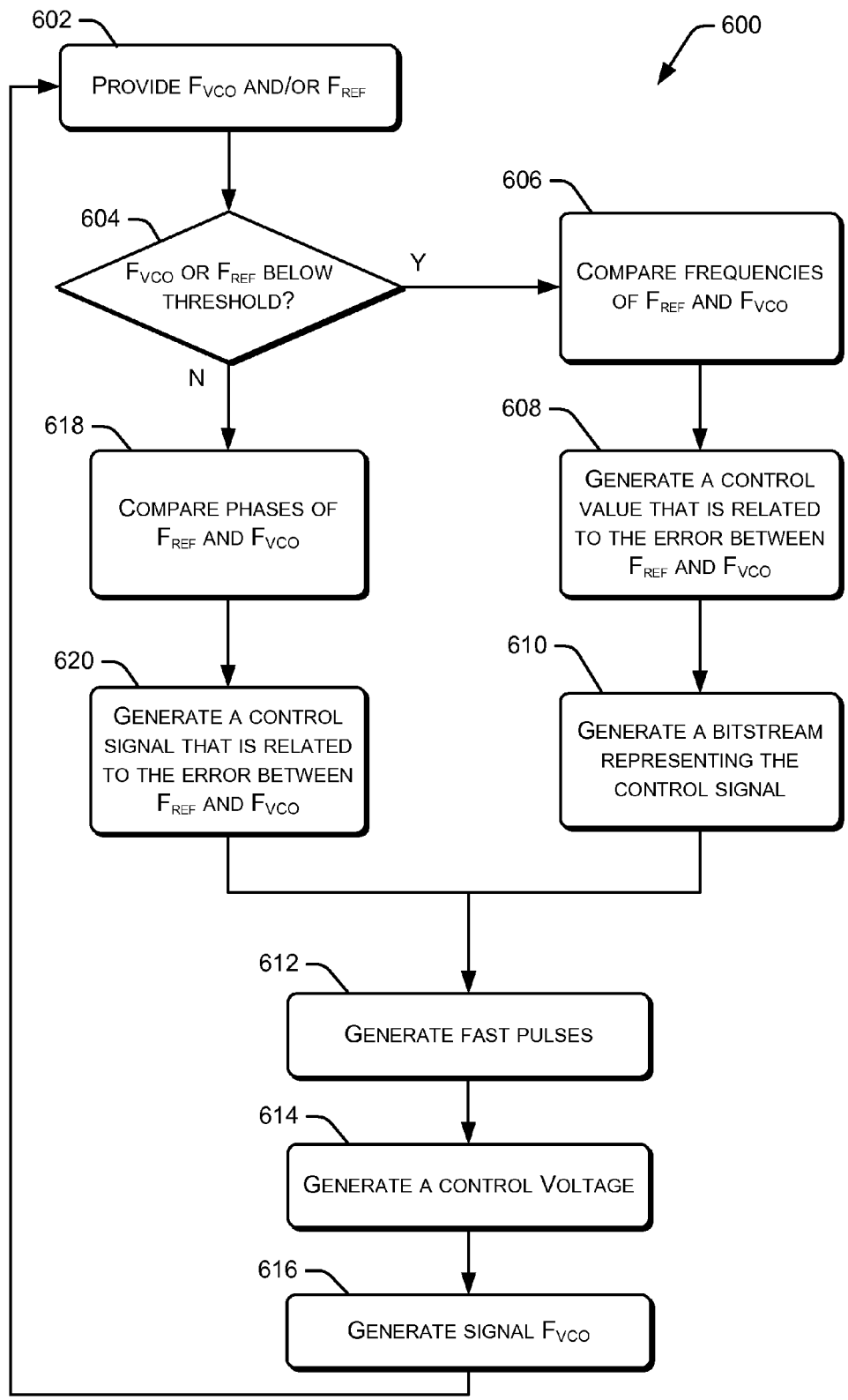
FIG. 6 shows a flow diagram of an exemplary process of handling signals having a variety of frequencies.

FIG. 6 shows a process 600 of operation of a locked loop system, such as the dual mode loop system 300. For convenience of discussion, FIG. 6 will be described with reference to FIG. 3.

Specifics of exemplary methods are described below. However, it should be understood that certain acts need not be performed in the order described, and may be modified, and/ or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

At block 602, two signals, $F_{VCO}$ and $F_{REF}$, are provided. $F_{VCO}$ is generated by a voltage controlled oscillator, such as voltage controlled oscillator 302. A reference signal $F_{REF}$ is received by the system, e.g., system 300, and may be generated by one or more integrated or external signal sources.

At block 604, it is determined whether the frequency of the reference signal $F_{REF}$ and/or the output signal $F_{VCO}$ is below, or above, a pre-selected threshold value.

At block 606, if the reference signal $F_{REF}$ and/or the output signal $F_{VCO}$ has a frequency that is, for example, below the threshold value, the signals $F_{REF}$ and $F_{VCO}$ are compared using a frequency detector, such as frequency detector 314. $F_{VCO}$ may be divided prior to being fed to the frequency detector in order to more easily compare it to $F_{REF}$.

At block 608, based on the comparison performed at block 606, a control value is generated that is related to the error between the frequency of the reference signal and the frequency of the signal output by the voltage controlled oscillator. The control value may be a digital value or word and may be generated by, for example, the frequency detector 314.

At block 610, a bitstream is generated that represents the control value generated in block 608. This may be performed by delivering the control signal to, for example, bitstream generator 316 and converting the control signal into, for example, a pulse density modulated or dithered stream of bits. The digital clock for the frequency measurement of the frequency detector 314 may be derived from a suitable fraction of the local oscillator frequency, $F_{VCO}$.

At block 612, one or more fast pulses are generated based on an input signal, such as the bitstream generated at block 610. The fast pulses may be generated by, for example, charge pump 310. In such an instance, the charge pump receives the signal output by the bitstream generator 316 and generates one or more fast pulses that will drive the voltage controlled oscillator 302 to the desired frequency.

At block 614, the fast pulses may be processed to generate a control voltage. For example, a low-pass loop filter 312, may suppress the reference frequency and generate a steady control voltage at the voltage controlled oscillator 302.

At block 616, a signal $F_{VCO}$ is generated that is based on the control voltage generated at block 614. The process 600 may be repeated as desired using the signal $F_{VCO}$ generated at block 616.

If the frequency of the reference signal $F_{REF}$ and/or the output signal $F_{VCO}$ is determined, at block 604, not to be below the pre-selected threshold value as determined in block 604, the process 600 proceeds to block 618. A multiplexer, such as multiplexer 318, may be utilized and controlled to respond to $F_{VCO}$ or $F_{REF}$ having a frequency above or below the pre-selected threshold value and to drive the process 600 toward block 606 or 618.

At block 618, the phases of the signals $F_{REF}$ and $F_{VCO}$ are compared using a phase frequency detector, such as phase frequency detector 304. $F_{VCO}$ may be divided prior to being fed to the frequency detector in order to more easily compare it to $F_{REF}$.

At block 620, based on the comparison performed at block 618, a control signal is generated that is related to the difference in phase (frequency) between the $F_{REF}$ signal and the $F_{VCO}$ signal. The control signal may be generated by, for example, the frequency detector 304.

At block 612, one or more fast pulses are generated based on an input signal, such as the control signal generated at block 620. As mentioned, above, the fast pulses may be generated by, for example, charge pump 310. In such an instance, the charge pump 310 receives the signal output by the phase frequency detector 304 and generates one or more fast pulses that will drive the voltage controlled oscillator 302 to the desired frequency.

At block 614, the fast pulses may be processed to generate a control voltage. For example, a low-pass loop filter 312, may suppress the reference frequency and generate a steady control voltage at the voltage controlled oscillator 302.

At block 616, a signal $F_{VCO}$ is generated that is based on the control voltage generated at block 614. The process 600 may be repeated as desired using the signal $F_{VCO}$ generated at block 616.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. A system comprising:
   a phase locked loop circuit having at least one component to generate a signal that is locked to a phase of a high frequency reference signal;
   a frequency locked loop circuit having at least one component to generate a signal that is locked to a frequency of a low frequency reference signal, the frequency locked loop utilizing at least one component of the phase locked loop circuit; and
   a switch to toggle between a locked low frequency mode of the system utilizing the frequency locked loop circuit and a locked high frequency mode of the system utilizing the phase locked loop circuit;
   wherein the frequency locked loop circuit includes a frequency detector and a bitstream generator, wherein the switch is switchably coupled to the bitstream generator and the frequency detector is coupled to the bitstream generator.

2. A system as recited in claim 1, wherein the phase locked loop circuit comprises:
   a voltage controlled oscillator;
   a frequency divider coupled to the voltage controlled oscillator;
   a phase frequency detector coupled to the frequency divider and to the switch;
   a charge pump coupled to the switch; and
   a loop filter coupled to the charge pump and to the voltage controlled oscillator.

3. A system as recited in claim 2, wherein the frequency locked loop circuit utilizes the voltage controlled oscillator of the phase locked loop.

4. A system as recited in claim 2, wherein the frequency locked loop circuit utilizes the loop filter of the phase locked loop circuit.

5. A system as recited in claim 2, wherein the frequency locked loop circuit utilizes the charge pump of the phase locked loop circuit.

6. A system as recited in claim 1, wherein the switch is a multiplexer.

7. A system to perform a frequency locked loop function, the system comprising:
   a voltage controlled oscillator;
   a frequency detector coupled to the voltage controlled oscillator;
   a bitstream generator coupled to the frequency detector;
   a charge pump coupled to the bitstream generator; and
   a loop filter coupled to the charge pump and the voltage controlled oscillator;
   wherein the system is operable in the phase locked loop mode to generate a signal that is locked to a phase of a high frequency reference signal, and operable in the frequency locked loop mode to generate a signal that is locked to a frequency of a low frequency reference signal.

8. A system as recited in claim 7, further comprising a multiplexer operable to toggle the system between a frequency locked loop mode and a phase locked loop mode.

9. A system as recited in claim 7, wherein the charge pump, the loop filter, and the voltage controlled oscillator are utilized in both the phase locked loop mode and the frequency locked loop mode.

10. A system as recited in claim 7 wherein the system is operable in the phase locked loop mode to generate a signal that is locked to a phase of a high reference signal, and operable in the frequency locked loop mode to generate a signal that is locked to a frequency of a low frequency reference signal.

11. A system as recited in claim 6, further comprising a phase frequency detector that is utilized in a phase locked loop mode to provide a control signal to the charge pump.

12. A process comprising:
    determining whether a first frequency of a first voltage controlled oscillator output signal or a second frequency of a reference signal is below a pre-selected threshold value for a system;
    comparing the first frequency of the first voltage controlled oscillator output signal to the second frequency of the reference signal if the first frequency or the second frequency is determined to be below the pre-selected threshold value for the system, then the system is operating in a locked low frequency mode utilizing a frequency locked loop circuit;
    comparing a first phase of the first voltage controlled oscillator output signal to a second phase of the reference signal if the first frequency or the second frequency is not below the pre-selected threshold value for the system, then the system is operating in a locked high frequency mode utilizing a phase locked loop circuit; and
    generating a second controlled voltage oscillator output signal having a third frequency based upon the comparison of the first and second frequencies or upon the comparison of the first and second phases.

13. A process as recited in claim 12, wherein if the first frequency or the second frequency is below the pre-selected threshold value, the process further comprises:
    generating a control value that is related to a difference between the first and second frequencies;
    generating a bitstream representing the control value;
    generating one or more fast pulses based on the bitstream;
    processing the fast pulses to generate a control voltage and generating the second voltage controlled oscillator output signal based on the control voltage.

14. A process as recited in claim 12, further comprising:
    determining whether the third frequency of the second controlled voltage oscillator output signal or the second frequency of the reference signal is below the pre-selected threshold value; and
    if the third frequency or the second frequency is below the pre-selected threshold value,
    comparing the third frequency to the second frequency,
    generating a control value that is related to the difference between the third frequency to the second frequency,
    generating a bitstream representing the control value, generating one or more fast pulses based on the bitstream, processing the fast pulses to generate a control voltage, and generating a third voltage controlled oscillator output signal based on the control voltage.

15. A process as recited in claim 12, wherein if the first frequency or the second frequency is not below the preselected threshold value, the process further comprises:
generating a control signal that is related to the difference between the first phase of the first voltage controlled oscillator output signal and the second phase of the reference signal,
generating one or more fast pulses based on the control signal,
processing the fast pulses to generate a control voltage, and generating the second voltage controlled oscillator output signal based on the control voltage.

16. A process as recited in claim 12, wherein the first frequency is divided prior to being compared to the second frequency.

17. A process as recited in claim 13, further comprising controlling a multiplexer to toggle between comparing the first frequency to the second frequency and comparing the first phase to the second phase.

18. A process as recited in claim 13, wherein generating one or more fast pulses based on the bitstream is performed using a charge pump of a phase locked loop device.

* * * * *

UNITED STATES PATENT AND TRADEMARK OFFICE
CERTIFICATE OF CORRECTION

PATENT NO. : 7,642,861 B2  Page 1 of 1
APPLICATION NO. : 11/863126
DATED : January 5, 2010
INVENTOR(S) : Michael Lewis et al.

It is certified that error appears in the above-identified patent and that said Letters Patent is hereby corrected as shown below:

On the Title Page, Item (73) Assignee change "Infineon Technologies" to -- Infineon Technologies AG --.

Signed and Sealed this

Nineteenth Day of April, 2011

David J. Kappos
*Director of the United States Patent and Trademark Office*